United States Patent
Chang

(10) Patent No.: US 10,008,689 B2
(45) Date of Patent: Jun. 26, 2018

(54) DISPLAY PANEL, DISPLAY DEVICE AND METHOD OF MANUFACTURING DISPLAY PANEL

(71) Applicant: BOE TECHNOLOGY GROUP CO., LTD., Beijing (CN)

(72) Inventor: Chia Hao Chang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 14/368,961

(22) PCT Filed: Dec. 5, 2013

(86) PCT No.: PCT/CN2013/088564
§ 371 (c)(1),
(2) Date: Jun. 26, 2014

(87) PCT Pub. No.: WO2015/043064
PCT Pub. Date: Apr. 2, 2015

(65) Prior Publication Data
US 2015/0091045 A1    Apr. 2, 2015

(30) Foreign Application Priority Data
Sep. 27, 2013    (CN) .......................... 2013 1 0452579

(51) Int. Cl.
*H01L 33/00*    (2010.01)
*H01L 51/52*    (2006.01)
(Continued)

(52) U.S. Cl.
CPC .......... *H01L 51/5246* (2013.01); *H01L 33/62* (2013.01); *H01L 51/5243* (2013.01);
(Continued)

(58) Field of Classification Search
CPC . H01L 51/5253; H01L 51/56; H01L 51/5243; H01L 51/5246; H01L 51/5237;
(Continued)

(56) References Cited

U.S. PATENT DOCUMENTS 8,319,355 B2 * 11/2012 Shih .................... H01L 51/5246
257/100
2007/0090759 A1 * 4/2007 Choi .................... H01L 51/524
313/512
(Continued)

FOREIGN PATENT DOCUMENTS

CN    1527644 A    9/2004
CN    1617636 A    5/2005
(Continued)

OTHER PUBLICATIONS

International Search Report Appln. No. PCT/CN2013/088564; dated Jul. 9, 2014.
(Continued)

*Primary Examiner* — Thinh T Nguyen
(74) *Attorney, Agent, or Firm* — Ladas & Parry LLP

(57) ABSTRACT

A display panel includes a first substrate and a second substrate sealed by sealant, and an inorganic material thin film is also formed outside the sealant. The display panel possesses a better characteristic of water and oxygen isolation in a lateral direction. A manufacturing method of a display panel and a display device including the display panel are further disclosed.

9 Claims, 1 Drawing Sheet

(51) Int. Cl.
  *H01L 33/62* (2010.01)
  *H01L 33/48* (2010.01)
  *H01L 33/56* (2010.01)
  *H01L 33/32* (2010.01)
  *H01L 33/38* (2010.01)
  *H01L 25/075* (2006.01)

(52) U.S. Cl.
  CPC ...... *H01L 51/5253* (2013.01); *H01L 25/0753* (2013.01); *H01L 33/32* (2013.01); *H01L 33/38* (2013.01); *H01L 33/486* (2013.01); *H01L 33/56* (2013.01); *H01L 2924/01079* (2013.01)

(58) Field of Classification Search
  CPC  H01L 428/239; Y10T 428/239; C09D 163/00
  USPC .......... 257/100, 99, 704, 678, 787, E51.001; 438/26, 28, 29
  See application file for complete search history.

(56) References Cited

U.S. PATENT DOCUMENTS

| | | | | |
|---|---|---|---|---|
| 2007/0172971 | A1* | 7/2007 | Borosen | H01L 51/5246 438/26 |
| 2008/0057260 | A1* | 3/2008 | Buchhauser | H01L 51/5237 428/76 |
| 2009/0065049 | A1* | 3/2009 | Son | H01J 7/183 136/256 |
| 2009/0302760 | A1* | 12/2009 | Tchakarov | H01L 51/5203 313/512 |
| 2012/0119247 | A1* | 5/2012 | Shih | C09D 163/00 257/99 |
| 2013/0011599 | A1* | 1/2013 | Buchhauser | H01L 51/5253 428/76 |
| 2013/0248828 | A1 | 9/2013 | Schaepkens et al. | |
| 2014/0061612 | A1 | 3/2014 | Yamazaki et al. | |

FOREIGN PATENT DOCUMENTS

| | | |
|---|---|---|
| CN | 1947278 A | 4/2007 |
| CN | 1957485 A | 5/2007 |
| CN | 101320748 A | 12/2008 |
| CN | 102157695 A | 8/2011 |
| CN | 102437288 A | 5/2012 |
| CN | 103137648 A | 6/2013 |
| CN | 203445127 U | 2/2014 |
| CN | 103681756 A | 3/2014 |

OTHER PUBLICATIONS

First Chinese Office Action Appln. No. 2013104525790; dated Jul. 22, 2014.
Second Chinese Office Action Appln. No. 201310452579.0; dated Nov. 27, 2014.
Chinese Rejection Decision Appln. No. 201310452579.0: dated Jan. 20, 2015.
International Preliminary Report on Patentability Appln. No. PCT/CN2013/088564; dated Mar. 29, 2016.

\* cited by examiner

US 10,008,689 B2

DISPLAY PANEL, DISPLAY DEVICE AND METHOD OF MANUFACTURING DISPLAY PANEL

TECHNICAL FIELD

Embodiments of the present invention relate to a display panel, a display device and a method of manufacturing the display panel.

BACKGROUND

An existing display panel mostly comprises two substrates: a first substrate and a second substrate, and the two substrates form a display panel by sealing with sealant all around the two substrates. For example, in an Organic Light-Emitting Diode (OLED) display panel, the first substrate is an OLED array substrate, the second substrate is a glass substrate for protection, and the two substrates sandwich the OLED array between the two substrates by sealing with sealant all around the two substrates. In addition the function of bonding the two substrates together, another function of the sealant is to supply the display panel with the capability of isolating water and oxygen isolation in the lateral direction. However, because the sealant material has a weak characteristic of water and oxygen isolation itself, in order to reduce the permeation of water and oxygen into the display panel in the lateral direction, it is necessary to enlarge the width of the sealant.

FIG. 1 is a schematic diagram of an existing OLED display panel, and the OLED display panel comprises: an OLED array substrate 120 comprising a plurality of OLED 110 which forms a pixel array, a glass substrate 130, and a sealant 140 provided all around the substrates. It is seen that the sealant 140 has a larger width W', about 2 mm~3 mm.

Enlargement of the width of the sealant prevents the permeation of water and oxygen to some degree, but because the sealant material has a defect of a weak characteristic of water and oxygen isolation itself, water and oxygen permeates through the sealant after a long-term use, the sealant material can not efficiently isolate water and oxygen itself. Meanwhile, the application mode of the above sealant makes the width of the frame of the display panel increase, and it is unable to manufacture a popular narrow-frame display panel.

SUMMARY

An aspect of the present invention provides a display panel, comprising: a first substrate and a second substrate sealed by sealant, and an inorganic material thin film is formed outside the sealant.

For example, in the display panel, the inorganic material thin film may be a single layer thin film of one selected from a metal oxide thin film, a silicon oxide thin film or a silicon nitride thin film.

For example, in the display panel, the inorganic material thin film may be a multiple-layer thin film of at least two selected from a metal oxide thin film, a silicon oxide thin film and a silicon nitride thin film.

For example, in the display panel, the metal oxide thin film may be an $Al_2O_3$ thin film.

For example, in the display panel, a width of the sealant is no more than 1 mm.

For example, in the display panel, a width of the inorganic material thin film is no more than 10 μm.

Another aspect of the present invention provides a manufacturing method of a display panel, comprising: providing a first substrate and a second substrate, sealing the first substrate and the second substrate with sealant, and forming an inorganic material thin film outside the sealant.

For example, in the method, an inorganic material thin film is deposited outside the sealant through an atomic layer depositing method.

For example, in the method, an inorganic material thin film is deposited outside the sealant through a chemical vapor depositing method.

For example, in the method, the inorganic material thin film may be a single layer thin film of one selected from a metal oxide thin film, a silicon oxide thin film or a silicon nitride thin film; or a multiple-layer thin film of at least two selected from a metal oxide thin film, a silicon oxide thin film and a silicon nitride thin film.

Yet another aspect of the present invention provides a display device adopting the above display panel.

An inorganic material thin film is formed outside the sealant of the display panel in the embodiments of the present invention; the inorganic material thin film possess a better characteristic of water and oxygen isolation with regard to the sealant, so as to afford the display panel with a better characteristic of water and oxygen isolation in the lateral direction.

BRIEF DESCRIPTION OF THE DRAWINGS

In order to clearly illustrate the technical solution of the embodiments of the invention, the drawings of the embodiments will be briefly described in the following: it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 2:
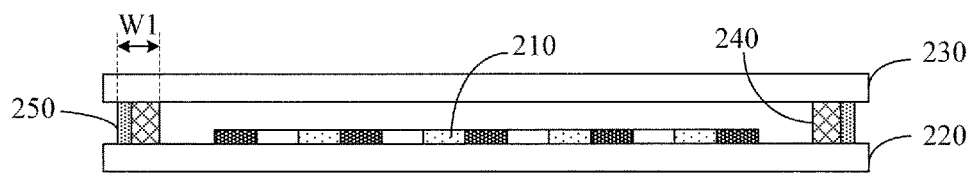
FIG. 2 is a structural schematic diagram of a display panel of an embodiment of the present invention.

As illustrated in FIG. 2, a display panel of an embodiment of the present invention comprises: a first substrate 220 and a second substrate 230 sealed with sealant 240. An OLED display panel is taken as an example (but not limited in OLED panel, a liquid crystal panel may be applicable), the first substrate 220 is an OLED array substrate, which comprises a pixel array formed by OLEDs 210, the second substrate 220 is a glass substrate, and the two substrates sandwich the OLED array between the two substrates by sealing with sealant all around the two substrates. In order to make the display panel maintain a good characteristic of water and oxygen isolation in the lateral direction, in the present embodiment, an inorganic material thin film 250 is formed outside the sealant 240. The inorganic material thin film 250 is also interposed between the first substrate 220 and the second substrate 230, and surrounds the sealant 240 from all sides to isolate the sealant 240 from the outer atmosphere environment.

In the present embodiment, the inorganic material thin film 250 may be a metal oxide thin film, a silicon oxide thin film or a silicon nitride thin film. Because aluminum (Al) possesses a chemical characteristic to be easily oxidized, and $Al_2O_3$ possesses an excellent characteristic of water and oxygen isolation, preferably the metal oxide thin film is an $Al_2O_3$ thin film.

Figure 3:
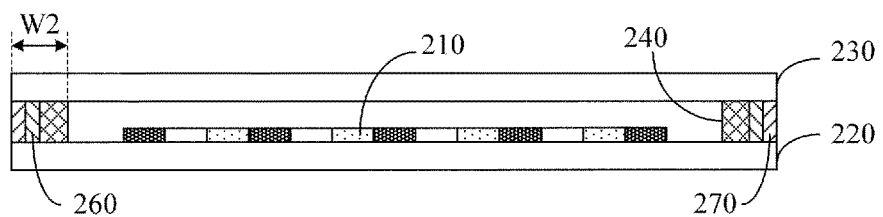
FIG. 3 is a structural schematic diagram of another display panel of an embodiment of the present invention.

Furthermore, in order to achieve a better characteristic of water and oxygen isolation, a plurality of inorganic material thin films may be formed outside the sealant 240. As illustrated in FIG. 3, two inorganic material thin films are formed outside the sealant 240: a first inorganic material thin film 260 and a second inorganic material thin film 270 formed outside the first inorganic material thin film 260. The first inorganic material thin film 260 and the second inorganic material 270 may be respectively formed of different materials selected from a metal oxide thin film, a silicon oxide thin film or a silicon nitride oxide thin film. The first inorganic material thin film 260 and the second inorganic material thin film 270 are also interposed between the first substrate 220 and the second substrate 260, and surround the sealant 240 from all sides to isolate the sealant 240 from the outer atmosphere environment.

An inorganic material thin film 250 is formed outside the sealant 240 of the display panel of the present embodiment; the inorganic material thin film 250 possesses a better characteristic of water and oxygen isolation itself, supplying the display panel with a better characteristic of water and oxygen isolation in the lateral direction.

Because the characteristic of water and oxygen isolation of the inorganic material thin film 250 is better than that of the sealant 240 in the case of a same thickness, the thickness of the sealant 240 can be notably decreased. Under the condition that the thickness of the sealant 240 to achieve enough bonding intensity can guaranteed, the thickness thereof, for example, may be no more than 1 mm. The thickness of the inorganic material thin film 250 may be no more than 10 μm. Thus, the sum of the thicknesses of the sealant and the inorganic material thin film of the embodiment of the present invention is much smaller than the thickness of the traditional sealant as illustrated in FIG. 1, it is possible to decrease the frame thickness of the display panel and to realize narrow-frame display panel while maintaining a better characteristic of water and oxygen isolation.

Figure 1:
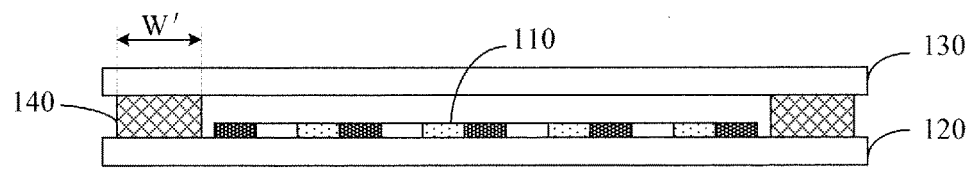
FIG. 1 is a structural schematic diagram of an existing display panel.

As illustrated in FIG. 2, the sum W1 of the thicknesses of the sealant 240 and the inorganic material thin film 250 is much smaller than the thickness of the traditional sealant as illustrated in FIG. 1; and as illustrated in FIG. 3, the sum W2 of the thicknesses of the sealant 240, the first inorganic material thin film 260 and the second inorganic material thin film 270 is also much smaller than the thickness of the traditional sealant as illustrated in FIG. 1.

An embodiment of the present invention provides a manufacturing method of a display panel, comprising: preparing a first substrate and a second substrate with sealant to seal the first substrate and the second substrate, and then forming an inorganic material thin film outside the sealant. The first and second substrates may be substrates prepared in advance. The inorganic material thin film may be a single layer thin film of one selected from a metal oxide thin film, a silicon oxide thin film or a silicon nitride thin film, or a multiple-layer thin film of at least two selected from a metal oxide thin film, a silicon oxide thin film and a silicon nitride thin film.

In the present embodiment, the step of forming an inorganic material thin film outside the sealant may be conducted by an atomic layer depositing method (ALD) to deposit inorganic material thin film outside the sealant. Because $Al_2O_3$ can be conveniently formed by ALD, forming of an $Al_2O_3$ thin film will be described in following as an example.

Firstly, a display panel having been sealed with sealant is placed into an ALD chamber, tri-methyl aluminum (TMA), water and other reactant(s) are introduced to perform an ALD filming process to form an $Al_2O_3$ thin film by stacking the atomic layers layer-by-layer. If a multiple-layer thin film is adopted, after the $Al_2O_3$ thin film is deposited other reactive gas may be introduced to deposit $ZrO_2$ (gases of $ZrCl_4$ and water are imported) for example.

In the present embodiment, the step of forming an inorganic material thin film outside the sealant may by conducted by a chemical vapor depositing method (CVD) to deposit inorganic material thin film outside the sealant. A SiNx thin film is taken as an example; firstly the display panel having been sealed by sealant is placed into a CVD chamber, and gases of $SiH_4$, $NH_3$ and other reactant(s) are introduced to perform a CVD filming process to form a SiNx thin film. If a multiple-layer thin film is adopted, after the SiNx thin film is deposited other reactive gas may be introduced to deposit SiONx (gases of $SiH_4$ and $N_2O$ are imported) for example.

Because a film is formed outside the sealant (the sealant is usually located in the space of the lateral surface of the display panel), and ALD is more suitable for extending into space in lateral film formation than CVD, the embodiments preferably adopt ALD method to form the inorganic material thin film.

An embodiment of the present invention further provides a display device which adopts the above display panel; the display device may be a liquid crystal display panel, an electronic paper, an OLED panel, a cell phone, a flat plane computer, a television, a display, a note computer, a digital photo frame, a navigator and any other products or components having display function.

What are described above is related to the illustrative embodiments of the disclosure only, and not limitative to the scope of the disclosure, the scopes of the disclosure are defined by the accompanying claims.

The invention claimed is:

1. A display panel comprising:
    a first substrate;
    a second substrate; and
    sealant disposed between the first substrate and the second substrate and possessing bonding intensity to bond the first substrate and the second substrate together and to seal space between the first substrate and the second substrate,
    wherein an inorganic material thin film is formed outside the sealant and between the first substrate and the second substrate, the inorganic material thin film is a double-layer thin film of an $Al_2O_3$ thin film and a $ZrO_2$ thin film, and a sum of thicknesses of the sealant and the inorganic material thin film is less than 2 mm.

2. The display panel according to claim 1, wherein a thickness of the sealant is no more than 1 mm.

3. The display panel according to claim 1, wherein a thickness of the inorganic material thin film is no more than 10 μm.

4. A manufacturing method of a display panel, comprising:
providing a first substrate and a second substrate,
sealing the first substrate and the second substrate with sealant, wherein the sealant is disposed between the first substrate and the second substrate and possessing bonding intensity to bond the first substrate and the second substrate together and to seal space between the first substrate and the second substrate, and
forming an inorganic material thin film outside the sealant after sealing, wherein the inorganic material thin film is between the first substrate and the second substrate and a double-layer thin film of an $Al_2O_3$ thin film and a $ZrO_2$ thin film, and a sum of thicknesses of the sealant and the inorganic material thin film is less than 2 mm.

5. The manufacturing method of a display panel according to claim 4, wherein the inorganic material thin film is formed outside the sealant by an atomic layer depositing method.

6. The manufacturing method of a display panel according to claim 4, wherein the inorganic material thin film is formed outside the sealant by a chemical vapor depositing method.

7. A display device, comprising a display panel comprising:
a first substrate;
a second substrate; and
sealant disposed between the first substrate and the second substrate and possessing bonding intensity to bond the first substrate and the second substrate together and to seal space between the first substrate and the second substrate,
wherein an inorganic material thin film is formed outside the sealant and between the first substrate and the second substrate, the inorganic material thin film is a double-layer thin film of an $Al_2O_3$ thin film and a $ZrO_2$ thin film, and a sum of thicknesses of the sealant and the inorganic material thin film is less than 2 mm.

8. The display device according to claim 7, wherein a thickness of the sealant is no more than 1 mm.

9. The display device according to claim 7, wherein a thickness of the inorganic material thin film is no more than 10 μm.

* * * * *